United States Patent
Guo et al.

(10) Patent No.: US 7,115,896 B2
(45) Date of Patent: Oct. 3, 2006

(54) SEMICONDUCTOR STRUCTURES FOR GALLIUM NITRIDE-BASED DEVICES

(75) Inventors: Shiping Guo, North Brunswick, NJ (US); David Gotthold, Hillsborough, NJ (US); Milan Pophristic, North Brunswick, NJ (US); Boris Peres, Jersey City, NJ (US); Ivan Eliashevich, Maplewood, NJ (US); Bryan S. Shelton, Bound Brook, NJ (US); Alex D. Ceruzzi, Princeton Junction, NJ (US); Michael Murphy, Somerset, NJ (US); Richard A. Stall, Belle Mead, NJ (US)

(73) Assignee: Emcore Corporation, Somerset, NJ (US)

( * ) Notice: Subject to any disclaimer, the term of this patent is extended or adjusted under 35 U.S.C. 154(b) by 118 days.

(21) Appl. No.: 10/721,488

(22) Filed: Nov. 25, 2003

(65) Prior Publication Data

US 2004/0119063 A1 Jun. 24, 2004

Related U.S. Application Data

(60) Provisional application No. 60/430,837, filed on Dec. 4, 2002.

(51) Int. Cl.
*H01L 29/06* (2006.01)
(52) U.S. Cl. .......................... 257/15; 257/18; 257/190; 257/449; 257/E33.034
(58) Field of Classification Search .................. 257/18, 257/103, 190, 449, 453, 472, 15, 96, E33.034, 257/E33.051
See application file for complete search history.

(56) References Cited

U.S. PATENT DOCUMENTS 5,158,909 A 10/1992 Ohtsuka et al.

(Continued)

FOREIGN PATENT DOCUMENTS

DE 4210402 10/1992

(Continued)

OTHER PUBLICATIONS

Yanagihara, et al., "Development of GaN-Based Electronic Device on Si", Sanken Technical Report, vol. 35, No. 1 (2003), pp. 11-14, Japan (English—language translation of Japanese—language publication).

(Continued)

*Primary Examiner*—Minh-Loan Tran
(74) *Attorney, Agent, or Firm*—Lerner, David, Littenberg Krumholz & Mentlik, LLP

(57) ABSTRACT

A nitride semiconductor is grown on a silicon substrate by depositing a few mono-layers of aluminum to protect the silicon substrate from ammonia used during the growth process, and then forming a nucleation layer from aluminum nitride and a buffer structure including multiple superlattices of $Al_R Ga_{(1-R)}N$ semiconductors having different compositions and an intermediate layer of GaN or other Ga-rich nitride semiconductor. The resulting structure has superior crystal quality. The silicon substrate used in epitaxial growth is removed before completion of the device so as to provide superior electrical properties in devices such as high-electron mobility transistors.

31 Claims, 5 Drawing Sheets

U.S. PATENT DOCUMENTS

| | | | |
|---|---|---|---|
| 5,602,418 | A | 2/1997 | Imai et al. |
| 5,622,877 | A | 4/1997 | Ashkinazi et al. |
| 5,877,558 | A | 3/1999 | Nakamura et al. |
| 5,956,578 | A | 9/1999 | Weitzel et al. |
| 6,110,277 | A * | 8/2000 | Braun ........................ 117/94 |
| 6,255,198 | B1 | 7/2001 | Linthicum et al. |
| 6,323,053 | B1 | 11/2001 | Nishikawa et al. |
| 6,437,374 | B1 | 8/2002 | Northrup et al. |
| 6,507,041 | B1 | 1/2003 | Nakamura et al. |
| 6,515,306 | B1 * | 2/2003 | Kuo et al. .................... 257/82 |
| 6,524,900 | B1 | 2/2003 | Dahlqvist et al. |
| 6,576,973 | B1 | 6/2003 | Collard et al. |
| 6,586,777 | B1 | 7/2003 | Yuasa et al. |
| 6,586,781 | B1 | 7/2003 | Wu et al. |
| 6,602,764 | B1 | 8/2003 | Linthicum et al. |
| 6,608,327 | B1 | 8/2003 | Davis et al. |
| 6,610,995 | B1 | 8/2003 | Nakamura et al. |
| 6,617,060 | B1 * | 9/2003 | Weeks et al. ............... 428/698 |
| 2003/0015708 | A1 | 1/2003 | Parikh et al. |
| 2003/0062525 | A1 | 4/2003 | Parikh et al. |
| 2003/0075728 | A1 | 4/2003 | Tool et al. |
| 2004/0195562 | A1 * | 10/2004 | Munns ........................ 257/1 |

FOREIGN PATENT DOCUMENTS

| | | |
|---|---|---|
| EP | 0 380 340 | 4/1992 |
| WO | WO 02/48434 A2 | 6/2002 |

OTHER PUBLICATIONS

Brown, et al., "AlGaN/GaN HFETs Fabricated on 100-mm GaN on Silicon (111) Substrates," Solid-State Electronics, vol. 46, pp. 1535-1539 (2002).

Feltin, et al., "Stress Control in GaN Grown on Silicon (111) by Metalorganic Vapor Phase Epitaxy," Applied Physics Letters, vol. 79, No. 20, pp. 3230-3232 (Nov. 12, 2001).

Marchand, et al., "Metalorganic Chemical Vapor Deposition of GaN on Si (111): Stress Control and Application to Field-Effect Transistors," Journal of Applied Physics, vol. 89, No. 12, pp. 7846-7851 (Jun. 15, 2001).

Armitage, et al., "Lattice-Matched HfN Buffer Layers for Epitaxy of GaN on Si," Applied Physics Letters, vol. 81, No. 8, pp. 1450-1452 (Aug. 15, 2002).

Manohar, et al., "Characteristics of Microwave Power GaN HEMTs on 4-inch Si Wafers," 2002 IEEE International Microwave Symposium, Seattle WA.

Kalisch, et al., "Growth and Characterisation of AlGaN/GaN HEMT on Silicon Substrates".

Dadgar, et al., "MOVCD Grown AlGaN/GaN FETs on Si(111)".

Poschenrieder, et al., "Bright Blue to Orange Photoluminescence Emission from High-Quality InGaN/GaN Multiple-Quantum-Wells on Si(111) Substrates," Applied Physics Letters, vol. 81, No. 9, pp. 1591-1593 (Aug. 26, 2002).

Jang, et al., "Characteristics of GaN/Si(111) Epitaxy Grown Using $Al_{0.1}Ga_{0.9}N/AlN$ Composite Nucleation Layers Having Different Thicknesses of AlN," Journal of Crystal Growth, vol. 241, pp. 289-296 (2002).

Wan, et al., "Growth of Crack-Free Hexagonal GaN Films on Si(100)," Applied Physics Letters, vol. 79, No. 10, pp. 1459-1461 (Sep. 3, 2001).

Tran, et al., "Growth of InGaN/GaN Multiple-Quantum-Well Blue Light-Emitting Diodes on Silicon by Metalorganic Vapor Phase Epitaxy," Applied Physics Letters, vol. 75, No. 11, pp. 1494-1496 (Sep. 13, 1999).

Dadgar, et al., "Thick, Crack-Free Blue Light-Emitting Diodes on Si(111) Using Low-Temperature AlN Interlayers and *In Situ* $Si_xN_y$ Masking," Applied Physics Letters, vol. 80, No. 20, pp. 3670-3672 (May 20, 2002).

* cited by examiner

SEMICONDUCTOR STRUCTURES FOR GALLIUM NITRIDE-BASED DEVICES

CROSS-REFERENCE TO RELATED APPLICATIONS

This application claims benefit of U.S. Provisional Patent Application Ser. No. 60/430,837, filed Dec. 4, 2002, the disclosure of which is incorporated by reference herein.

BACKGROUND OF THE INVENTION

The present invention relates to nitride semiconductor structures and devices and to processes for making the same.

Nitride semiconductors such as gallium nitride and related semiconductors are widely regarded as desirable wide bandgap compound semiconductors. These materials have been adopted in optoelectronic devices such as light-emitting diodes ("LEDs"), laser diodes and photodiodes, and have also been employed in non-optical electronic devices such as field effect transistors ("FETs") and field emitters. In optoelectronic devices, the wide bandgap of the material allows for emission or absorption of light in the visible-to-ultraviolet range. In electronic devices, gallium nitride and related materials provide high electron mobility and allow for operation at very high signal frequencies.

Nitride semiconductors typically are formed by epitaxial growth on a substrate. In an epitaxial growth process, the constituents of the semiconductor film to be formed are deposited on a crystalline substrate so that the deposited semiconductor material has a crystal structure patterned on the crystal structure of the substrate. Various epitaxial growth processes use different techniques for delivering the materials to the surface of the substrate. For example, in reactive sputtering, the metallic constituent of the semiconductor as, for example, gallium, aluminum or indium, is dislodged from a metallic sputtering target in proximity to the substrate in an atmosphere which includes nitrogen. In a process known as metal organic chemical vapor deposition (MOCVD), the substrate is exposed to an atmosphere containing organic compounds of the metals and a reactive, nitrogen-containing gas, most commonly ammonia, while the substrate is at an elevated temperature, typically on the order of 700–1100° C. Under these conditions, the compounds decompose, leaving the metal nitride semiconductor as a thin film of crystalline material on the surface. After growth of the film, the substrate and grown film are cooled and further processed to form the finished devices.

To provide a high quality nitride semiconductor film, with relatively few crystal defects, the substrate used for crystal growth should ideally have a lattice spacing (spacing between adjacent atoms in its crystal lattice) equal to that of the nitride semiconductor to be grown. If the lattice spacing of the substrate is substantially different than that of the grown film, the grown film will have defects such as dislocations in the crystal lattice. Also, the substrate should have a coefficient of thermal expansion equal to or greater than that of the nitride semiconductor to be grown, so that when the substrate and nitride semiconductor are cooled to room temperature after growth, the substrate contracts to a greater degree than the film, placing the film in compression. If the coefficient of thermal expansion of the substrate is substantially smaller than that of the grown film, the film will tend to contract more than the substrate, placing the film in tension when the film and substrate are cooled. This can cause cracks in the film.

Gallium nitride based semiconductors are most commonly grown on crystalline sapphire wafers. Satisfactory results can be achieved on sapphire, despite a relatively large lattice mismatch between sapphire and gallium nitride. Silicon carbide, in theory, is a more desirable material for growth of high-quality gallium nitride, inasmuch as it has a smaller lattice mismatch. Moreover, silicon carbide has higher thermal conductivity than sapphire, which aids in dissipating heat from the finished device. However, high-quality, crystalline silicon carbide wafers are very expensive and, at the present time, are not available in large sizes greater than about 100 mm (4 inches) in diameter.

High-quality silicon substrates are widely available at reasonable cost. However, the lattice spacing of silicon is not well matched to that of gallium nitride. Moreover, silicon has a lower coefficient of thermal expansion than gallium nitride, so that gallium nitride films grown on silicon tend to crack when the film and substrate are cooled to room temperature. Moreover, silicon substrates are relatively poor electrical insulators. Where the deposited nitride semiconductor is used in certain electronic devices, such as FET's, the substrate causes significant electrical losses in the device and limits the performance of the device. For all of these reasons, silicon has not been widely adopted as a substrate for growing nitride semiconductors.

Various proposals have been advanced to compensate for the lattice mismatch and thermal expansion mismatch between the nitride semiconductors and silicon. For example, Nitronics, International Publication No. WO 02/48434, suggests using a "compositionally graded transition layer" formed on a silicon substrate and depositing a gallium nitride material over the transitionally graded layer. The transition layer may contain aluminum indium gallium nitride, indium gallium nitride or aluminum gallium nitride, with proportions of aluminum, indium and gallium varying from a back surface adjacent the substrate to a front surface upon which the semiconductor is to be grown. The compositionally graded layer may include a "superlattice," i.e., a crystalline structure having a periodic variation in composition as, for example, different amounts of aluminum, indium and gallium.

Another approach taught in Feltin et al., "Stress Control In GaN Grown On Silicon (111) By Metal Organic Vapor Phase Epitaxy," Applied Physics Letters, Vol. 79, No. 20, pp. 3230–3232 (Nov. 12, 2001), utilizes an aluminum nitride buffer layer in direct contact with the silicon substrate. A layer of gallium nitride is deposited over the aluminum nitride buffer layer, followed by a superlattice including alternating layers of aluminum nitride and gallium nitride, followed by further gallium nitride layers and superlattices and, finally, by a layer of gallium nitride at the top of the structure which constitutes the active semiconductor layer to be grown. According to the Feltin et al. article, this approach yields a high-quality, active layer.

Despite these and other efforts in the prior art, however, it has been difficult to grow high-quality gallium nitride-based semiconductors on silicon substrates. Moreover, devices such as FETs fabricated from gallium nitride-based semiconductors on silicon substrates have suffered from performance problems caused by the silicon substrate itself.

SUMMARY OF THE INVENTION

One aspect of the present invention provides a method of making a semiconductor structure including the steps of depositing a small amount of aluminum directly on a silicon substrate to provide an aluminum protected substrate, and then depositing a nucleation layer of a nitride semiconductor on the aluminum protected substrate. Most preferably, the nucleation layer is formed from a nitride semiconductor having a metal content consisting predominantly of aluminum, most preferably substantially pure aluminum nitride. The method according to this aspect of the invention preferably further includes the step of epitaxially growing a buffer structure including one or more superlattices of nitride semiconductor on the nucleation layer, and then epitaxially growing an operative structure including one or more gallium nitride-based semiconductors on the buffer structure.

A further aspect of the present invention provides methods of making a semiconductor structure including the steps of depositing a nucleation layer of a nitride semiconductor on a silicon substrate and epitaxially growing a buffer structure including one or more superlattices of nitride semiconductors on the nucleation layer such that the first superlattice of nitride semiconductors is grown directly on the nucleation layer, without an intervening layer. Here again, the method includes the step of epitaxially growing an operative structure including one or more gallium nitride-based semiconductors on the buffer structure. Most desirably, the step of growing the buffer structure includes growing an intermediate layer of a gallium nitride-based semiconductor over the first superlattice of the buffer structure and growing a second superlattice of nitride semiconductors over the intermediate layer. The most preferred methods according to the invention combine both of the foregoing aspects. Thus, the nucleation layer is formed by first depositing some aluminum on the substrate and then depositing the nitride semiconductor to form the nucleation layer, and the buffer structure includes a first superlattice directly in contact with the nucleation layer.

Methods according to the foregoing aspects of the present invention can provide high-quality gallium nitride-based semiconductors in the operative structure. Although the present invention is not limited by any theory of operation, it is believed that the superlattices introduce compressive strain into the gallium nitride-based semiconductor materials in the structure and, hence, prevent cracking of the gallium nitride based semiconductor layers. Further, it is also believed that the superlattices serve as "filters" which limit propagation of crystalline defects such as those referred to as threading dislocations from the lower layers of the structure upwardly into the operative structure at the top. These factors are believed to contribute to the high crystal quality of the gallium nitride-based semiconductors in the operative structure. Further, it is believed that the superlattices tend to limit diffusion of silicon into the gallium nitride-based semiconductors. As further discussed below, this prevent incidental, unwanted doping of the semiconductors in the operative structure with silicon from the substrate. It is also believed that placing the first superlattice of the buffer structure on the nucleation layer, without an intervening layer of gallium nitride between the nucleation layer and the first superlattice, further suppresses formation of crystal defects and hence improves crystal quality. It is additionally believed that pretreatment of the substrate with aluminum, prior to deposition of the nucleation layer, protects the substrate from etching by ammonia. Regardless of the mechanism of operation, however, the preferred methods according to this aspect of the invention can form high-quality nitride semiconductor films, on silicon substrates.

Related aspects of the present invention provide semiconductor structures incorporating a silicon substrate, a layer of aluminum directly overlying the substrate, and a nucleation layer of a nitride semiconductor directly overlying the aluminum layer, together with a buffer structure including one or more superlattices overlying the nucleating layer, and an operative structure including one or more gallium nitride based semiconductors overlying the buffer structure.

Semiconductor structures according to a further aspect of the invention incorporate a silicon substrate, a nucleation layer of a nitride semiconductor overlying the substrate, and buffer structure incorporating a first superlattice directly overlying the nucleation layer, together with an operative structure including one or more gallium nitride-based semiconductors overlying the buffer structure. Here again, the most preferred structures incorporates both aspects of the invention and, hence, include a first superlattice directly overlying the nucleation layer and an aluminum layer between the nucleation layer and the substrate. Most preferably, the buffer structure includes the first superlattice, an intermediate layer of a gallium nitride-based semiconductor, most preferably pure gallium nitride overlying the first superlattice, and a second superlattice overlying the intermediate layer. The superlattices desirably are formed from multiple layers of semiconductor compounds according to the formula $Al_R Ga_{(1-R)}N$, where R is from 0 to 1 inclusive. Preferably, each superlattice is formed from two different such compounds, i.e., two compounds having different values of R.

A further aspect of the present invention provides a method of making a semiconductor element including the steps of epitaxially growing a nitride semiconductor structure on a silicon substrate, then bonding a carrier to the nitride semiconductor structure, and then removing the silicon substrate from the nitride semiconductor structure. Most preferably, the method according to this aspect of the invention further includes the steps of applying a base material other than silicon on the nitride semiconductor structure after removing the silicon substrate and then removing the carrier, so as to leave the nitride semiconductor structure on the base material. Methods according to this aspect of the present invention provide finished structures without the silicon wafer used as a substrate during epitaxial growth. The base material may be essentially high-quality insulator which can be applied conveniently to the nitride semiconductor structure. Merely by way of example, the base material may include aluminum nitride or diamond-like carbon deposited on the exposed surface of the nitride semiconductor structure after removal of the substrate. A related aspect of the present invention provides a semiconductor element including a nitride semiconductor structure having one or more epitaxially grown layers and a base supporting the nitride semiconductor structure, the base being a structure other than a substrate used in epitaxially growth of the nitride semiconductor structure. Most preferably, the element according to this aspect of the invention does not include the substrate used in epitaxial growth of the nitride semiconductor structure.

These aspects of the present invention incorporate the realization that the electrical performance limitations associated with a silicon substrate can be resolved readily by removing the substrate after growth and substituting a different base material which typically would be unsuitable for epitaxial growth.

According to another aspect of the invention, a vertical current conduction Schottky diode includes a silicon substrate. At least one layer of nitride semiconductor overlies a surface of the silicon substrate. At least one first metal layer overlies the layer of nitride semiconductor and forms a Schottky contact therewith. At least one further metal layer overlies another surface of the silicon substrate and forms an ohmic contact therewith.

The layer of nitride semiconductor may include GaN or another gallium nitride-based semiconductor. A further layer of nitride semiconductor may be disposed between the silicon substrate and the first layer of nitride semiconductor, and the further layer of nitride semiconductor may have a higher doping concentration than that of the first layer of nitride semiconductor. The further layer may include GaN or another gallium nitride based semiconductor. The first layer of nitride semiconductor and the first metal layer may overlay an entire width of the layer of nitride semiconductor. Alternatively, the first layer of nitride semiconductor and the first metal layer overlay a portion of the silicon substrate.

A vertical current conduction Schottky diode is made in accordance with a still further aspect of the invention. At least one layer of nitride semiconductor is formed on the surface of the silicon substrate. At least one first metal layer is deposited on the layer of nitride semiconductor to form a Schottky contact therewith. At least one further metal layer is deposited on another surface of the silicon substrate to form an ohmic contact therewith.

The layer of nitride semiconductor may include GaN or another gallium nitride-based semiconductor. A further layer of nitride semiconductor may be formed prior to forming the first layer of nitride semiconductor and has a higher doping concentration than that of the first layer of nitride semiconductor. The further layer may include GaN or another gallium nitride based semiconductor. A portion of the first layer of nitride semiconductor may be removed such that the layer of nitride semiconductor forms a mesa structure.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

As used in the present disclosure, the term "III–V semiconductor" refers to a compound semiconductor material according to the stoichiometric formula $Al_aIn_bGa_cN_dAs_eP_f$ where (a+b+c) is about 1 and (d+e+f) is also about 1. The term "nitride semiconductor" or "nitride-based semiconductor" refers to a III–V semiconductor in which d is 0.5 or more, most typically about 0.8 or more. Most preferably, the semiconductor materials are pure nitride semiconductors, i.e., nitride semiconductors in which d is about 1.0. The term "gallium nitride based semiconductor" as used herein refers to a nitride semiconductor including gallium, and most preferably including gallium as the principal metal present, i.e., having $c \geq 0.5$ and most preferably $\geq 0.8$. The semiconductors may have p-type or n-type conductivity, which may be imparted by conventional dopants and may also result from the inherent conductivity type of the particular semiconductor material. For example, gallium nitride-based semiconductors having defects typically are inherently n-type even when undoped. Conventional electron donor dopants such as Si, Ge, S, and O, can be used to impart n-type conductivity to nitride semiconductors, whereas p-type nitride semiconductors may include conventional electron acceptor dopants such as Mg and Zn.

Figure 1:
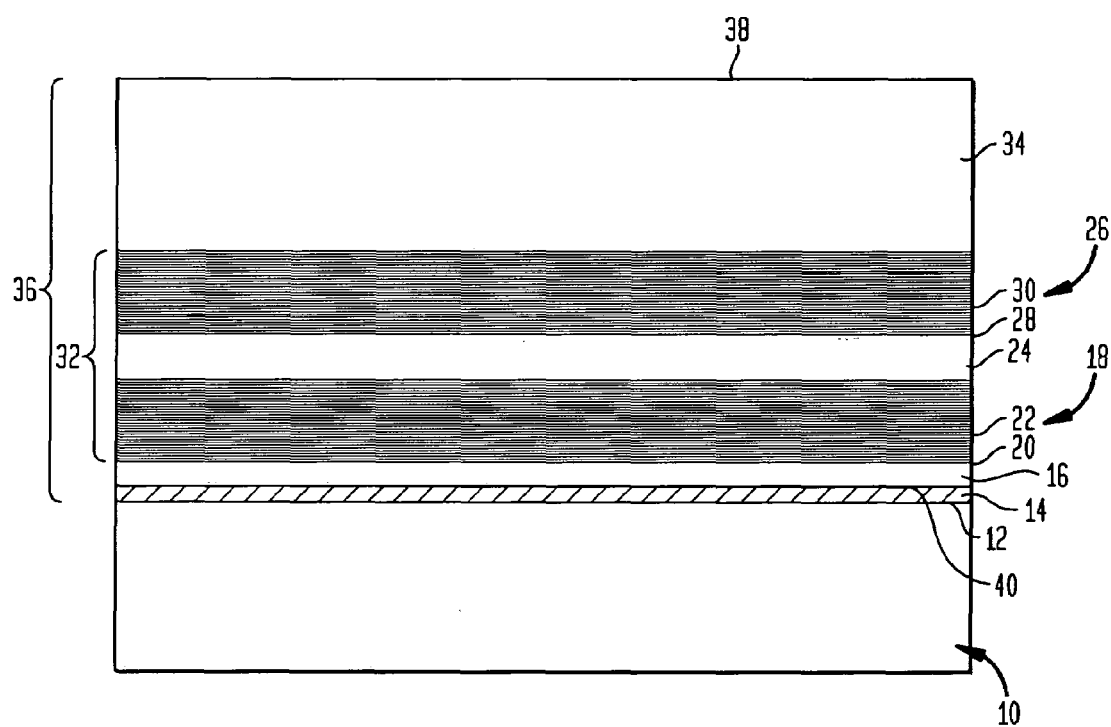
FIG. 1 is a fragmentary, diagrammatic sectional view on an enlarged scale of a semiconductor structure according to one embodiment of the present invention.

A process according to one embodiment of the present invention begins with a doped silicon substrate 10. The silicon substrate most preferably is a substantially monocrystalline silicon wafer having a polished, flat top surface 12. The top surface desirably is the (1,1,1) crystal plane of the silicon. In the first stage of the process, the wafer is brought to a temperature of about 600–900° C. in a conventional chemical vapor deposition apparatus and exposed to an organo-aluminum compound, most preferably a lower alkyl aluminum compound such as trimethyl aluminum ("TMA") in vapor form for a few seconds. The aluminum compound decomposes to deposit a thin aluminum layer 14 on the top surface 12 of the wafer. FIG. 1 is not drawn to scale. The thickness of aluminum layer 14 is greatly exaggerated for clarity of illustration. In practice, the aluminum layer includes only about 1–10 mono-layers of aluminum atoms and has a thickness less than about 100 Å, more preferably less than about 50 Å. Also, although the aluminum layer is depicted as a discrete, separate layer for clarity of illustration, it is believed that there is some diffusion of silicon into the aluminum layer 14 from substrate 10, and also some diffusion of nitrogen into the aluminum layer from the overlying layers discussed below. Thus, it is believed that in the finished article the aluminum layer will take the form of either a thin aluminum-rich zone at the upper surface of wafer 10. It is believed that the aluminum layer serves to protect the silicon substrate from etching during exposure to ammonia in subsequent process steps, and accordingly the substrate, with the aluminum layer, is referred to herein as an "aluminum-protected" silicon substrate.

Following deposition of the aluminum layer, the aluminum-protected substrate is exposed to a mixture of an organo-metallic compound, most preferably an organo-aluminum compound, and ammonia, together with a carrier gas, so as to deposit a thin layer 16 of a nitride semiconductor, most preferably AlN. The AlN is deposited at substrate temperature on the order of 600–900° C., i.e., a temperature low enough to promote deposition of the nitride semiconductor, such as AlN, in a substantially polycrystalline form resulting from nucleation of the nitride semiconductor at numerous sites on the substrate. Nucleation layer 16 desirably is about 20–50 nm thick; here again, its thickness is greatly exaggerated in FIG. 1 for clarity of illustration.

Following deposition of nucleation layer 16, a first superlattice 18 is deposited directly on the top of the nucleation layer. As used in this disclosure, the "top" surface of a grown semiconductor structure should be understood as the surface most remote from the substrate used in forming the structure, i.e., the surface facing upwardly in FIG. 1. Also, a statement that one structure is deposited "directly on" an other structure should be understood as meaning that the one structure directly abuts the top surface of the other structure, without intervening layers. By contrast, a statement that one structure is "over" an other structure should be understood as meaning that the one structure is more remote from the substrate than the other structure, but does not exclude the presence of intervening layers.

The first superlattice includes a plurality of layers 20 and 22 of nitride semiconductors having differing compositions. In a superlattice, the layers have thicknesses on the order of 10 nm or less, typically 5 nm or less and most commonly 3 nm or less, so that the overall structure is more in the nature of a composite crystal lattice than a set of discrete, individual layers. Preferably, each of layers 20 and 22 is formed from a pure nitride semiconductor selected from the group consisting of gallium nitride, aluminum nitride and aluminum gallium nitride, i.e., the group of semiconductors defined by the stoichiometric formula $Al_R Ga_{(1-R)}N$, with the layers having unequal values of R. That is, layer 20 has the formula $Al_X Ga_{(1-X)}N$, whereas layer 22 has the formula $Al_Y Ga_{(1-Y)}N$, where $X \neq Y$. Superlattice 18, as a whole, desirably includes about 5–15 repetitions of layers 20 and 22, most preferably about 10 repetitions. For example, layer 20 may be pure AlN, whereas layer 22 may be $Al_{0.5}Ga_{0.5}N$. A pure AlN layer is deposited by exposing the substrate to an organo-aluminum compound ammonia and carrier gas as discussed above, whereas an AlGaN layer is deposited by exposing the substrate to a similar gas mixture also incorporating an organo-gallium compound, desirably a lower alkyl organogallium compound such as trimethylgallium. The thicknesses of the aluminum gallium nitride layers 22 and aluminum nitride layers 20 desirably are substantially constant throughout the thickness of superlattice 18. However, this is not essential. The compositions and thicknesses of the layers can be varied within the superlattice to provide compositional grading within the superlattice, i.e., so that the overall proportion of gallium and aluminum within the superlattice varies in the upward direction, away from substrate 10. Also, the individual layers in the superlattice may include some indium in the metallic component.

Following deposition of the first superlattice 18, a thin intermediate layer 24 of a gallium nitride based semiconductor, most preferably GaN, is deposited by exposing the substrate to a mixture of an organo-gallium compound, ammonia and a carrier gas, at a temperature of about 950 to about 1100° C. Layer 24 most preferably is about 200 to about 400 nm thick.

A second superlattice 26 is formed over intermediate layer 24, desirably directly on the intermediate layer. The second superlattice is generally similar to the first superlattice 18 and incorporates alternating layers of an aluminum-rich nitride semiconductor such as AlN 28 and a gallium enriched nitride semiconductor such as $Al_{0.5}Ga_{0.5}N$. More generally, layers 28 have the stoiceometric formula $Al_P Ga_{(1-P)}N$ and layers 30 have the stoiceometric formula $Al_Q Ga_{(1-Q)}N$, where $P \neq Q$. The thicknesses and layer compositions in the second superlattice may be the same as or different from the thicknesses and layer compositions in the first superlattice. The period of the second superlattice 26 may be less than that of the first superlattice. The second superlattice may be superlattice composed of about 5–10 repetitions of layers 28 and 30.

The first superlattice 18, intermediate layer 24 and second superlattice 26 cooperatively constitute a buffer structure 32. After deposition of the buffer structure, an operative structure 34 is deposited over the buffer structure, and most preferably directly on the top surface of the second superlattice in the buffer structure. Operative structure 34 includes one or more gallium nitride based semiconductors and may include other semiconductors as well. In its simplest form, operative structure 34 may include one a single relatively thick layer of a gallium nitride based semiconductor such as pure GaN. In more complex forms, the operative structure may include plural layers having differing compositions and/or dopings as used, for example, to make conventional devices such as optical electronic devices such as light-emitting diodes, laser diodes and the like, or electronic devices such as field effect transistors and Schottky diodes. The gallium nitride based semiconductors in the operative structure may be deposited at conventional growth temperatures using MOCVD techniques. The resulting semiconductor structure incorporates a nitride structure 36 incorporating the nucleation layer 16, buffer structure 32 and operative structure 34. The nitride structure has a top surface 38 remote from substrate 10 and a bottom surface 40 adjacent substrate 10.

The gallium nitride based semiconductors in the operative structure have excellent crystal quality. After deposition, the structure can be cooled to room temperature and then removed from the reactor, without appreciable cracking of the gallium nitride based semiconductors in the operative structure. Although the present invention is not limited by any theory of operation, it is believed that the combination of the compressive stress induced by the superlattices in the operative structure and in the intermediate layer 24 serves to suppress formation of defects and, moreover, placement of the first superlattice below the lowest gallium nitride layer in the structure (below intermediate layer 24) serves to further limit the formation of crystal defects. It is also believed that the aluminum layer 14 serves to protect the silicon substrate from etching by the ammonia used to deposit the nitride semiconductors and, thus, serves to further limit formation of defects in the crystal. It is also believed that the compressive stress applied by the superlattices and, hence, by the buffer structure as a whole to the operative structure 34 serves to prevent cracking when the substrate and nitride structure are cooled to room temperature.

Conventional techniques used in high-quality chemical vapor deposition should be followed. Optionally, between deposition of layers having differing compositions as, for example, between deposition of the aluminum layer 14 and the buffer layer 16, and both before and after deposition of each superlattice, the chamber can be purged of metals from the preceding layer by flushing it with a mixture of the hydrogen or nitrogen carrier gas and ammonia for a prolonged period.

Figure 2A:
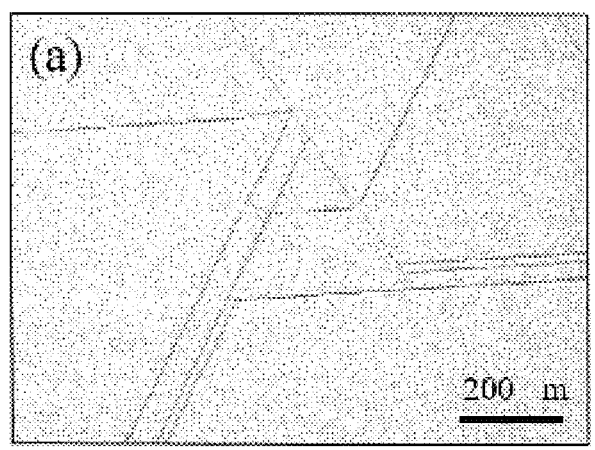
FIG. 2 is a comparative Nomarski image depicting a portion of a semiconductor structure in accordance with one embodiment of the present invention and another structure, not in accordance with the present invention, for comparison purposes.
Figure 2B:

The quality of the structure depicted in FIG. 1 is evidenced by the Nomarski images of FIG. 2. The imaged marked (a) is a Nomarski image of a structure which is not in accordance with the present invention, formed by depositing gallium nitride directly on an aluminum nitride nucleation layer, whereas the structure marked (b) in FIG. 2 shows comparable structure with the buffer structure as discussed above with reference to FIG. 1 between the nucleation layer and the gallium nitride layer. Structure (a) shows numerous lines representing crystal defects due to surface cracking, whereas structure (b) is substantially free of such defects.

The structure resulting from the process discussed above with reference to FIG. 1 can be further processed using conventional techniques to form individual devices as, for example, by subdividing the nitride structure 36 and the silicon substrate 10 to form individual units, each incorporating a portion of the nitride structure and a corresponding portion of substrate 10, and applying contacts to the resulting units and packaging the same.

More preferably, however, the substrate 10 is removed. In a process according to a further embodiment of the invention (FIG. 3), a semiconductor structure incorporating a silicon substrate 10 and a nitride structure 36, which may be the same as or different from the nitride structure discussed above with reference to FIGS. 1 and 2, is engaged with a temporary carrier 42 so that the top surface 38 of the nitride structure bears against the carrier, and the top surface of the nitride structure is bonded to the carrier, preferably by using a dielectric "glue" that promotes adhesion between the top nitride layer and the carrier. This dielectric can be, for example, benzocyclobutene (BCB), methylsilsesquioxane (MSSQ), or a material such as those sold under the commercial designations Flare™, SiLK™, Parylene-N and PETI 5. The surfaces of, the nitride structure, the carrier, or both, is or are coated with the glue and then the surfaces are brought into contact under a relatively low temperature, below 400° C. If the subsequent processing steps do not need to go above 100° C., other polymers such as HMDS or photoresist can be used. Additionally, if solvents such as acetone are not in future processing steps, such soluble adhesives such as wax or Crystalbond™ may be used.

Figure 3:
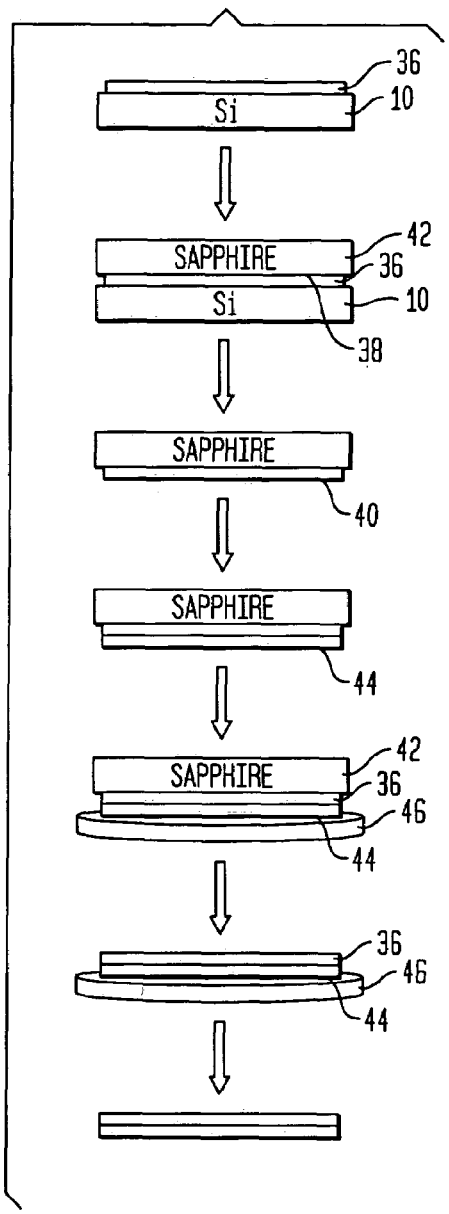
FIG. 3 is a process flow diagram depicting a process in accordance with a further embodiment of the invention.

Carrier 42 is illustrated in FIG. 3 as a sapphire element, but the carrier can be formed from other materials which are inert to the other reagents used in the processes to follow and which can survive at the temperatures used in the process. Most preferably, the carrier also has a coefficient of thermal expansion close to that of the nitride structure, and also does not contaminate the nitride structure. Thus, the carrier desirably is substantially free of materials which tend to diffuse into the nitride structure.

Following the carrier-bonding step, the substrate 10 is removed as by etching it away from the nitride structure 36, preferably by using an etchant such as a potassium hydroxide solution as, for example, 20% KOH by weight aqueous solution at 70° C., which attacks the silicon substrate but which does not appreciably attach the nitride structure. In this process, the nitride structure acts as a "etch stop"; the etching continues until the nitride structure is reached. An additional etch stop may be provided at or adjacent the nitride structure. For example, a layer of $SiO_2$ will effectively stop etching by KOH. Following removal of the substrate, the bottom surface 40 of the nitride structure is exposed. A base 44 is applied onto bottom surface 40, as by chemical vapor deposition or sputtering of a base material on the bottom surface. The base material desirably is a material having good electrical insulating properties such as aluminum nitride or a carbonaceous, diamond-like material. Base material 44 desirably also has relatively high thermal conductivity. Base material 44 may be grown on the exposed bottom surface of the nitride structure, even if there is a substantial crystal lattice mismatch between the nitride structure and the base material. The base material need not form as a mono-crystalline, defect-free structure, provided that the poly-crystalline or defect-laden base material retains the desired insulating properties. Merely by way of example, aluminum nitride or carbon can be deposited by chemical vapor deposition.

Following deposition of the base 44, a tape or other temporary handling element 46 is applied onto the exposed surface of base 44 and the carrier 42 is removed, leaving the nitride structure 36 on base 44 and physically supported by the base and by the tape or other temporary handling element 46, and leaving the nitride structure with its bottom surface 40 confronting the base 44. The resulting structure is devoid of the silicon substrate used during epitaxial growth of the nitride structure. The resulting structure can be subjected to conventional semiconductor processing techniques such as subdividing, application of contacts and mounting to a package to form one or more usable devices. In a further variant, the base material deposition step can be omitted.

Figure 4:
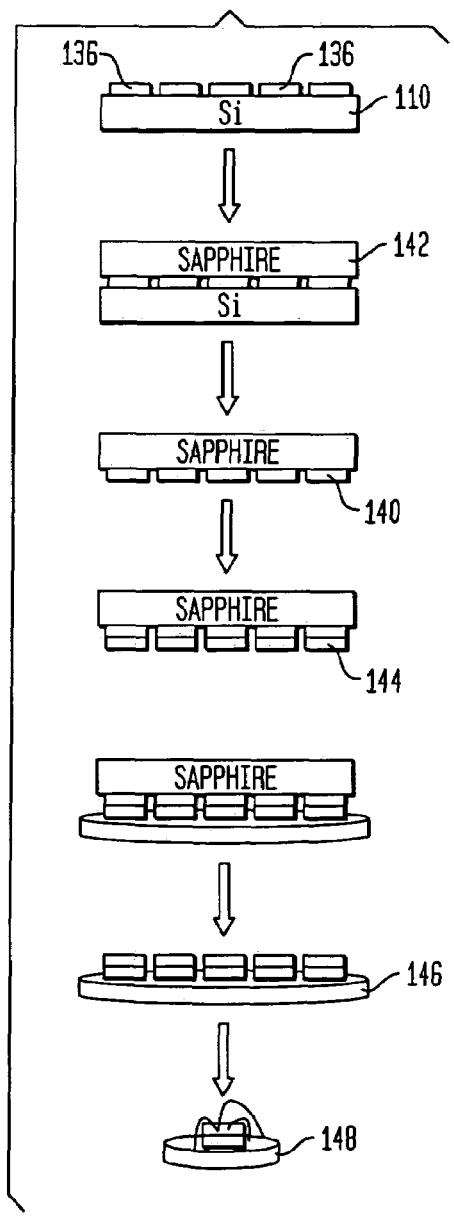
FIG. 4 is another process flow diagram depicting a process in accordance with yet another embodiment of the invention.

In a process according to a further embodiment of the invention (FIG. 4), a nitride structure on a silicon growth substrate 110 is subjected to post-growth processing as, for example, application of contacts, subdivision and etching so as to form a plurality of semi-finished gallium nitride devices 136 on the silicon growth substrate 110, each such semi-finished device incorporating a gallium nitride structure. The semi-finished devices are subjected to process steps similar to those discussed above with reference to FIG. 3, including application of a temporary carrier 142 overlying the top surfaces of the gallium nitride structures and removal of the substrate to expose the bottom surfaces 140 of these structures. Following removal of the substrate, again, a base material is applied so as to form a base 144 on each gallium nitride structure 140. Following application of the bases, a temporary handling element such as a tape 146 may be applied and the devices may be subjected to procedures such as lead-bonding and mounting on a package element 148.

The finished devices prepared according to the methods discussed above with reference to FIGS. 3 and 4 can provide superior electrical properties because the silicon substrate used in epitaxial growth of the nitride structure is not present in the finished device. Although relatively expensive materials as, for example, sapphire wafers are employed as temporary carriers, these can be recycled and reused, and form no part of the finished device.

Figure 5:
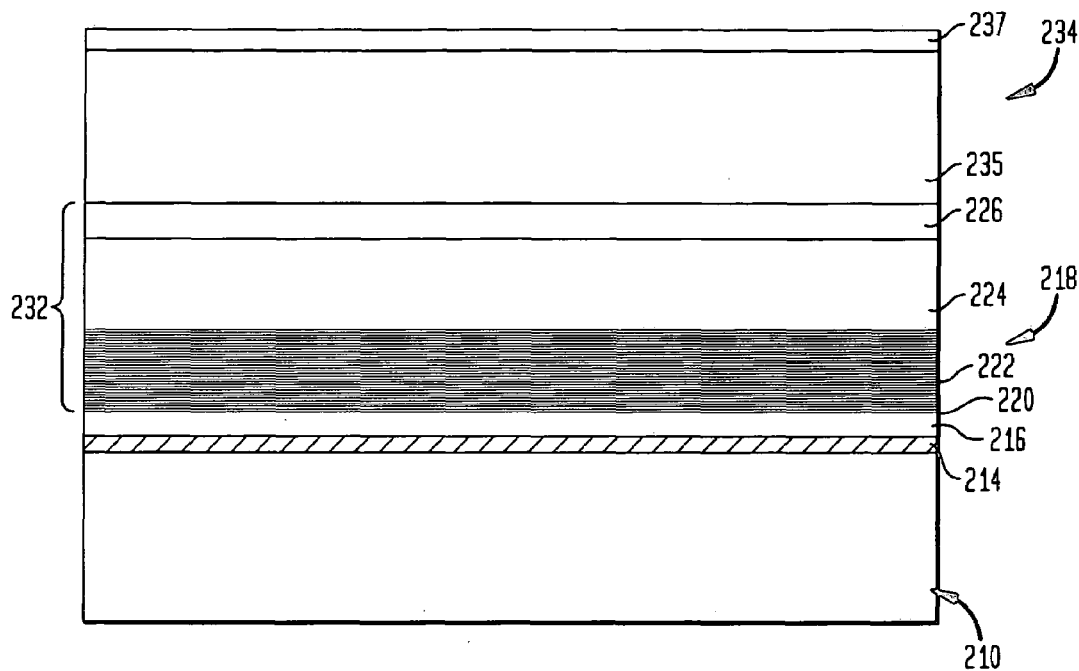
FIG. 5 is a view similar to that of FIG. 1 depicting a semiconductor structure according to a further embodiment of the invention.

Numerous variations and combinations of the features set forth above can be utilized without departing from the present invention as defined by the claims. For example, the aluminum layer and aluminum-protected silicon substrate discussed above can be utilized in growth of other nitride semiconductor structures and other III–V semiconductor structures. Also, the III–V semiconductors used in the preferred embodiments can be varied by addition of other group V elements as, for example, As and P. The buffer structure incorporated in the nitride structure may include more than two superlattices. Conversely, the intermediate layer and second superlattice can be omitted. In one such variant, depicted in FIG. 5, the second superlattice is omitted and replaced by a further polycrystalline nucleation layer as, for example, a layer of AlN deposited at a low temperature. This structure includes a substrate 210 and aluminum layer 214 identical to the corresponding structures discussed above with reference to FIG. 1. The nucleation layer 214 consists of 30 nm thick AlN. The buffer structure 232 includes a first superlattice 218 having 10 repetitions of a basic unit, each unit including a layer 220 of AlN 2 nm thick and a layer 222 of $Al_{0.3}Ga_{0.7}N$, also 2 nm thick. The buffer structure 232 further includes an intermediate layer 224 of GaN 0.4 μm thick, and a nucleation layer 226 of 13 nm thick polycrystalline AlN. The operative structure 235 includes a layer 235 of GaN 0.6 μm thick and a top layer 237 of $Al_{0.3}Ga_{0.7}N$ 23 nm thick. Layers 237 and 235 cooperatively provide a two-dimensional electron gas and contribute to operation of the device as a high electron mobility transistor.

Figure 6:
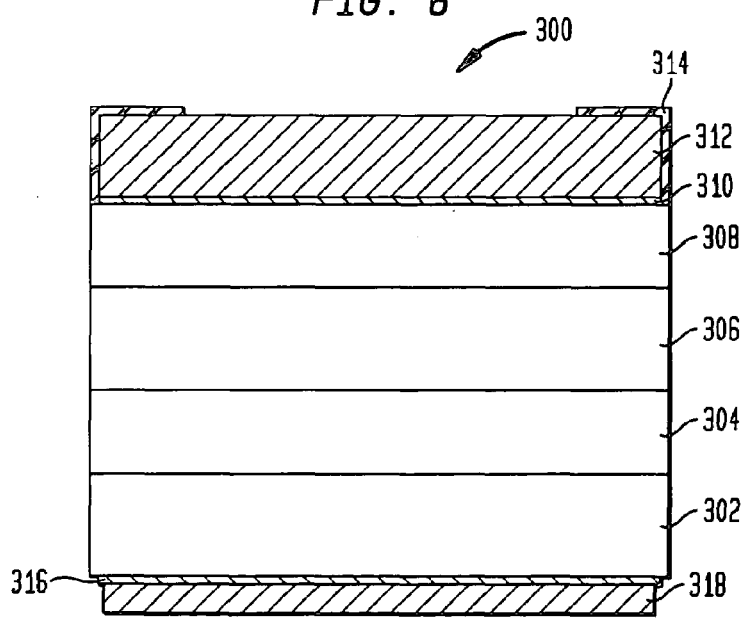
FIG. 6 is a fragmentary, diagrammatic sectional view on an enlarged scale of a Schottky diode according to a still further embodiment of the invention.

FIG. 6 illustrates a cross-sectional view of a nitride semiconductor Schottky diode 300 formed in accordance with a further embodiment of the invention. The Schottky diode 300 includes a doped silicon substrate 302 upon which is formed a buffer structure 304 which may be the buffer structure 32 shown in FIG. 1 or the buffer structure 232 shown in FIG. 5. The buffer structure typically has a thickness of between 0.1 to 10 microns. A highly doped n-type nitride semiconductor layer 306, such as a layer of GaN or other gallium nitride-based semiconductor, is formed atop the buffer structure 302 and has a doping concentration of between $10^{18}$ to $10^{19}$ $cm^{-3}$ with a thickness of between 0.1 to 10 microns. A lower doped n-type nitride semiconductor layer 308 is formed atop the highly doped nitride semiconductor layer and may also be comprised of GaN or another gallium nitride-based semiconductor. The concentration of dopants in the lower doped layer is between $10^{15}$ to $10^{16}$ $cm^{-3}$, and the layer has a thickness of between 0.1 to 10 microns. Alternatively, the more highly doped layer 306 is omitted, and the lower doped layer 308 is formed directly atop the buffer structure 304.

A Schottky contact layer 310 is deposited atop the lower doped layer 308 and preferably covers the complete width of the lower doped layer. A thick metal layer 312 is disposed atop the Schottky contact layer 310.

At the bottom of the device, a thin ohmic metal contact layer 316 is formed on the backside of the silicon substrate 302, and another metal stack 318 is deposited atop the ohmic metal layer 316. An optional passivation layer 314 may be formed atop all of or part of the Schottky contact metal layer 310 and the thick metal layer 312.

The structure of the Schottky diode 300 provides a forward direction, vertical current conduction path from the Schottky contact metal and through the low doped layer 308, the highly doped layer 306, the buffer structure 304 and the silicon substrate 302 to the ohmic metal layer 316 and metal stack 318. Additionally, the width of the Schottky contact metal layer 310 and the metal stack 312 provide a vertical conduction path that utilizes the full width of the Schottky diode structure.

Advantageously, the vertical conduction path minimizes the resistance of the device while under forward bias but maintains a high breakdown voltage while under reverse bias. The turn-on voltage of the device is typically between 0.5V and 1.5V while the breakdown voltage is greater than –100V. Additionally, the on-resistance of the device is less than 10–20 milliohm-$cm^2$, whereas known devices in the industry typically have resistances greater than this value.

The vertical conduction path of the Schottky diode is particularly useful in achieving a low on-resistance in a gallium nitride based diode even though the GaN and other nitride-based semiconductors used typically have relatively high resistances. Known GaN-based semiconductor devices grown on an insulating substrate, such as sapphire, typically use lateral conduction in the nitride-based layers to carry the forward current. The forward current must travel over a relatively long path as well as along relatively thin layers of highly resistive material that have small cross-sectional areas in the direction transverse to the direction of current flow. In such a lateral conduction structure, the path length is determined by the horizontal dimensions of the die (e.g., a millimeter or more) and the cross-sectional area is determined by the thickness of the GaN layers (e.g., a few microns). By contrast, in the vertical conduction structure of FIG. 6, the path length between the silicon substrate and the Schottky contact has a miniscule length, equal to the thickness of the GaN layers (a few microns), and has a substantial cross-sectional area, corresponding to the surface area of the die structure, thereby substantially reducing the resistance of the device.

Moreover, the reduction in on-resistance due to the vertical conducting structure is achieved using a relatively inexpensive, highly conductive silicon substrate. Using the preferred interfacial structures discussed above, this low on-resistance can be achieved while maintaining high crystal quality in the nitride-based semiconductors. Additionally, the doping levels in the nitride-based semiconductors can be relatively low, which aids in maintaining a high breakdown voltage, without incurring excessive on-resistance.

Figure 7:
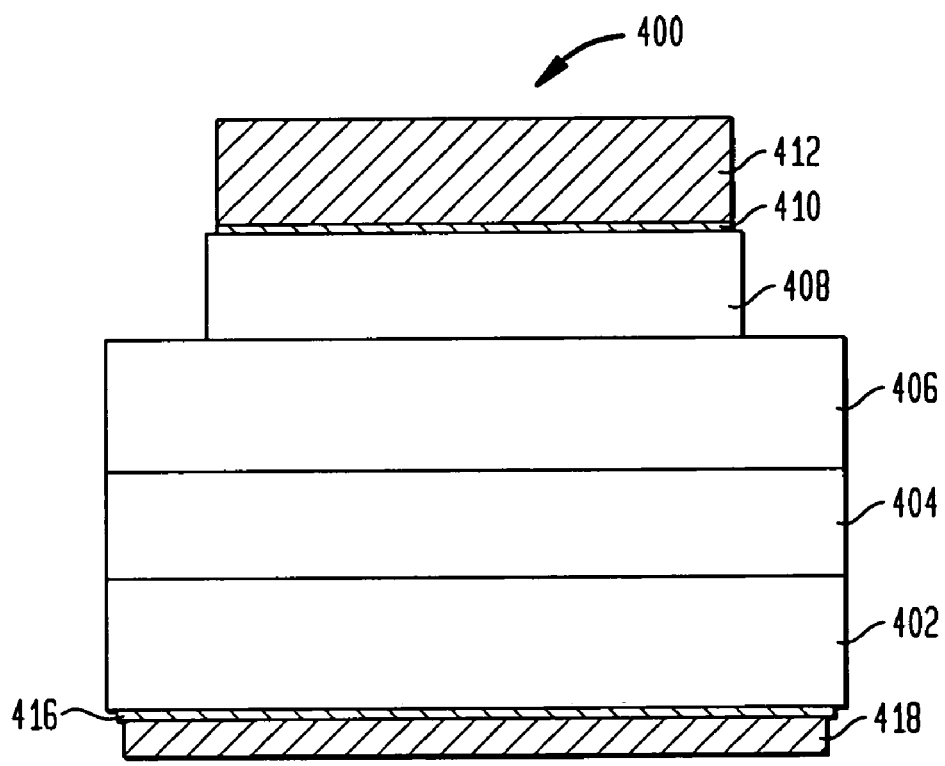
FIG. 7 is a view similar to that of FIG. 6 depicting a Schottky diode according to an additional embodiment of the invention.

FIG. 7 illustrates another embodiment of a vertical conduction Schottky diode 400 formed in accordance with the invention but having a mesa structure. A buffer structure 404 is formed on the top surface of a silicon substrate 402 in accordance with one of the methods descried above with a structure corresponding to one of the above-described structures. A highly doped, n-type nitride semiconductor layer 406 is disposed atop the buffer structure 404 and has a composition, doping concentration and thickness similar to the corresponding region of the device shown in FIG. 6. A lower doped, n-type nitride semiconductor layer 408 is formed atop the highly doped layer 406 and likewise has a composition, doping concentration and thickness similar to the corresponding region shown in FIG. 6. However, the width of the lower doped layer 408 is less than the width of the more highly doped layer. Additionally, the Schottky contact metal layer 410 and the upper thick metal stack 412 are similar in structure and thickness to the corresponding layers shown in FIG. 6 but have a width similar to the lower doped layer 408. An edge termination structure (not shown) may be formed to counter any edge effects resulting from the Schottky contact metal. A passivation layer may also be included. An ohmic contact metal layer 416 and a metal stack 418 are formed on the backside of the silicon substrate.

As these and other variations and combinations can be employed, the foregoing description of the preferred embodiments should be taken by way of illustration rather than by way of limitation of the invention as defined by the claims.

The invention claimed is:

1. A semiconductor structure comprising:
   (a) a silicon substrate;
   (b) a layer of aluminum directly overlying a first surface of said substrate;
   (c) a polycrystalline nucleation layer of a nitride semiconductor directly overlying said aluminum layer;
   (d) a buffer structure including one or more superlattices overlying said nucleation layer, each said superlattice including a plurality of nitride-based semiconductors of different compositions, each of said plurality of nitride-based semiconductors of at least one said superlattice having its respective composition according to the formula $Al_rGa_{(1-r)}N$, where $0<r<1$; and
   (e) an operative structure of one or more gallium nitride-based semiconductors overlying said buffer structure.

2. A structure as claimed in claim 1 wherein said buffer structure includes a first superlattice, an intermediate layer of a nitride-based semiconductor overlying the first superlattice, and a second superlattice overlying the intermediate layer.

3. A structure as claimed in claim 2 wherein each of said first and second superlattices consists essentially of a plurality of semiconductors each of which has its respective composition according to the formula $Al_rGa_{(1-r)}N$ where $0<r<1$.

4. A structure as claimed in claim 3 wherein each of said first and second superlattices consists of only two semiconductors having different values of r.

5. A structure as claimed in claim 4 wherein the semiconductors included in said first superlattice are the same as the semiconductors included in said second superlattice.

6. A structure as claimed in claim 3 wherein said first superlattice directly overlies said nucleation layer.

7. A structure as claimed in claim 6 wherein said nucleation layer consists essentially of aluminum nitride.

8. A structure as claimed in claim 1 wherein said buffer structure includes a first superlattice directly overlying said nucleation layer.

9. A structure as claimed in claim 8 wherein said nucleation layer consists essentially of aluminum nitride.

10. A structure as claimed in claim 1 wherein said operative structure includes a first layer of nitride semiconductor; said structure further comprising at least one first metal layer overlying said first layer of nitride semiconductor and forming a Schottky contact therewith.

11. A structure as claimed in claim 10 wherein said first layer of nitride semiconductor includes a gallium-nitride-based semiconductor.

12. A structure as claimed in claim 10 wherein said first layer of nitride semiconductor includes GaN.

13. A structure as claimed in claim 10 further comprising at least one further metal layer overlying a second surface of said silicon substrate and forming an ohmic contact therewith.

14. A structure as claimed in claim 10 wherein said operative structure includes a further layer of nitride semiconductor disposed between said first layer of nitride semiconductor and said buffer structure; said further layer of nitride semiconductor having a higher doping concentration than that of said first layer of nitride semiconductor.

15. A structure as claimed in claim 14 wherein said further layer of nitride semiconductor includes a gallium nitride-based semiconductor.

16. A structure as claimed in claim 14 wherein said further layer of nitride semiconductor includes GaN.

17. A structure as claimed in claim 10 wherein said first layer of nitride semiconductor overlays an entire width of said buffer structure, and said first metal layer overlays an entire width of said first layer of nitride semiconductor.

18. A structure as claimed in claim 10 wherein said first layer of nitride semiconductor overlays a portion of said buffer structure, and said first metal layer overlays an entire width of said first layer of nitride semiconductor.

19. A semiconductor structure comprising:
(a) a silicon substrate;
(b) a polycrystalline nucleation layer of a nitride semiconductor overlying a surface of said substrate;
(c) a buffer structure including a first superlattice directly overlying said nucleation layer, an intermediate layer of a nitride-based semiconductor overlying said first superlattice, and a second superlattice including a plurality of nitride-based semiconductors overlying said intermediate layer, said first superlattice including a plurality of nitride-based semiconductors of different compositions, each of said plurality of nitride-based semiconductors having its respective composition according to the formula $Al_rGa_{(1-r)}N$, where $0<r<1$, said second superlattice consisting essentially of a plurality of semiconductors each of which has its respective composition according to the formula $Al_rGa_{(1-r)}N$ where $0<r<1$; and
(e) an operative structure of one or more gallium nitride-based semiconductors overlying said buffer structure.

20. A structure as claimed in claim 19 wherein said nucleation layer consists essentially of aluminum nitride and said first superlattice consists essentially of semiconductors according to the formula $Al_rGa_{(1-r)}N$ where $0<r<1$.

21. A structure as claimed in claim 19 wherein each of said first and second superlattices consists of only two semiconductors having different values of r.

22. A structure as claimed in claim 21 wherein the semiconductors included in said first superlattice are the same as the semiconductors included in said second superlattice.

23. A structure as claimed in claim 19 wherein said operative structure includes a first layer of nitride semiconductor; said structure further comprising at least one first metal layer overlying said first layer of nitride semiconductor and forming a Schottky contact therewith.

24. A structure as claimed in claim 23 wherein said first layer of nitride semiconductor includes a gallium nitride-based semiconductor.

25. A structure as claimed in claim 23 wherein said first layer of nitride semiconductor includes GaN.

26. A structure as claimed in claim 23 further comprising at least one further metal layer overlying another surface of said silicon substrate and forming an ohmic contact therewith.

27. A structure as claimed in claim 23 wherein said operative structure includes a further layer of nitride semiconductor disposed between said first layer of nitride semiconductor and said buffer structure; said further layer of nitride semiconductor having a higher doping concentration than that of said first layer of nitride semiconductor.

28. A structure as claimed in claim 27 wherein said further layer of nitride semiconductor includes a gallium nitride-based semiconductor.

29. A structure as claimed in claim 27 wherein said further layer of nitride semiconductor includes GaN.

30. A structure as claimed in claim 23 wherein said first layer of nitride semiconductor overlays an entire width of said buffer structure, and said first metal layer overlays an entire width of said first layer of nitride semiconductor.

31. A structure as claimed in claim 23 wherein said first layer of nitride semiconductor overlays a portion of said buffer structure, and said first metal layer overlays an entire width of said first layer of nitride semiconductor.

* * * * *